United States Patent
Tan et al.

(10) Patent No.: US 8,295,045 B2
(45) Date of Patent: Oct. 23, 2012

(54) CASE AND ELECTRONIC DEVICE HAVING THE SAME

(75) Inventors: Zeu-Chia Tan, Taipei Hsien (TW);
Yao-Ting Chang, Taipei Hsien (TW);
Zhi-Bin Guan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 178 days.

(21) Appl. No.: 12/861,045

(22) Filed: Aug. 23, 2010

(65) Prior Publication Data
US 2011/0235273 A1    Sep. 29, 2011

(30) Foreign Application Priority Data
Mar. 29, 2010   (TW) ............................... 99109284 A

(51) Int. Cl.
*H05K 7/20*    (2006.01)
(52) U.S. Cl. ........ 361/695; 361/690; 361/691; 361/694; 361/719; 174/16.1
(58) Field of Classification Search ........................ None
See application file for complete search history.

(56) References Cited

U.S. PATENT DOCUMENTS

| | | | | |
|---|---|---|---|---|
| 6,011,689 | A * | 1/2000 | Wrycraft | 361/695 |
| 7,079,390 | B2 * | 7/2006 | Barr et al. | 361/690 |
| 7,120,018 | B2 * | 10/2006 | Shen et al. | 361/695 |
| 7,342,786 | B2 * | 3/2008 | Malone et al. | 361/695 |
| 7,403,388 | B2 * | 7/2008 | Chang | 361/695 |
| 7,586,745 | B1 * | 9/2009 | Szelong et al. | 361/695 |
| 7,760,498 | B2 * | 7/2010 | Shan et al. | 361/695 |
| 2008/0062644 | A1 * | 3/2008 | Petroski | 361/695 |
| 2008/0074841 | A1 * | 3/2008 | Curtis et al. | 361/695 |
| 2008/0273305 | A1 * | 11/2008 | Lee | 361/695 |

* cited by examiner

*Primary Examiner* — Boris Chervinsky
(74) *Attorney, Agent, or Firm* — Altis Law Group, Inc.

(57) ABSTRACT

A case includes a box, a top cover, a first airflow guide member, and a second airflow guide member. The box has an opening sealed by the top cover. The first airflow guide member and the second airflow guide member are fixed on at least one of the top cover and a side plate of the box. The first airflow guide member and the second airflow guide member are spaced from each other, and cooperatively define a guide channel. The box defines an inlet and an outlet communicating with the guide channel.

19 Claims, 4 Drawing Sheets

CASE AND ELECTRONIC DEVICE HAVING THE SAME

BACKGROUND

1. Technical Field

The present disclosure relates to electronic devices, and particularly, to an electronic device having a case.

2. Description of the Related Art

Electronic devices, such as computer hosts or servers, often include a case for housing components thereof, providing protection from debris and external contaminants, and for shielding electromagnetic interference.

An electronic device often includes a case, an electronic component fixed on and electrically connected to a motherboard, and an airflow guide above the electronic component, including a top cover and two side covers extending from opposite ends of the top cover, cooperatively defining an inlet and an outlet. A fan adjacent to the inlet generates cooling airflow from the inlet to the outlet. However, the airflow guide occupies space in the case at the interior of the electronic device, thereby increasing volume thereof.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
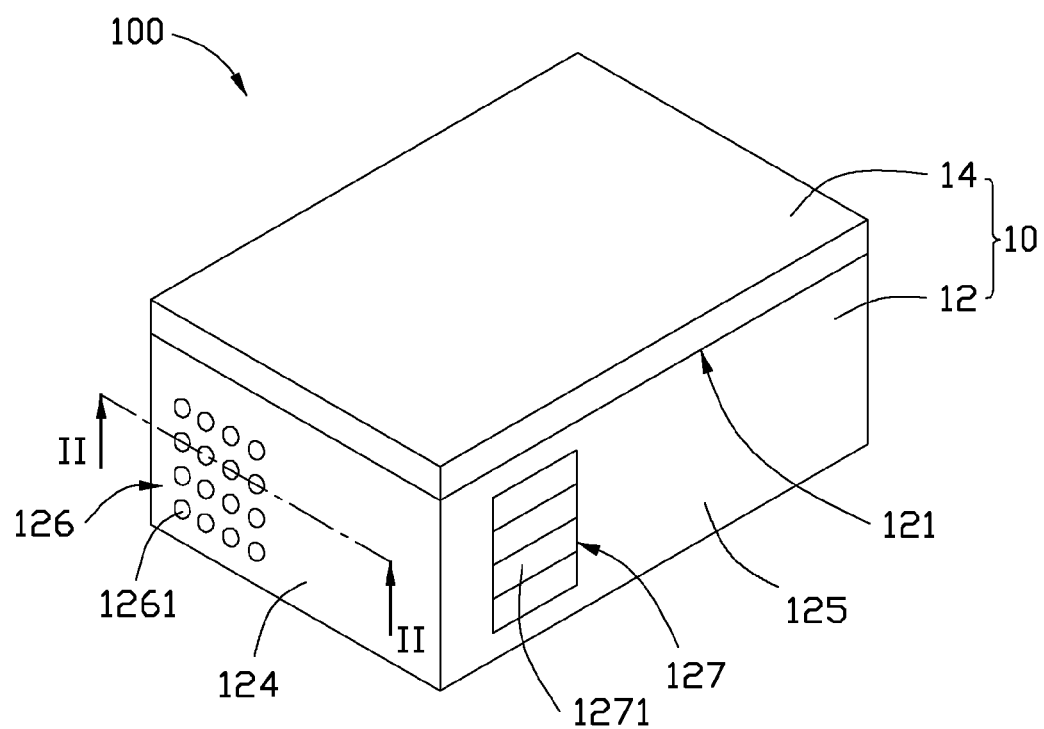
FIG. 1 is an isometric view of one embodiment of an electronic device including a top cover, a first airflow guide member, and a second airflow guide member.
Figure 2:
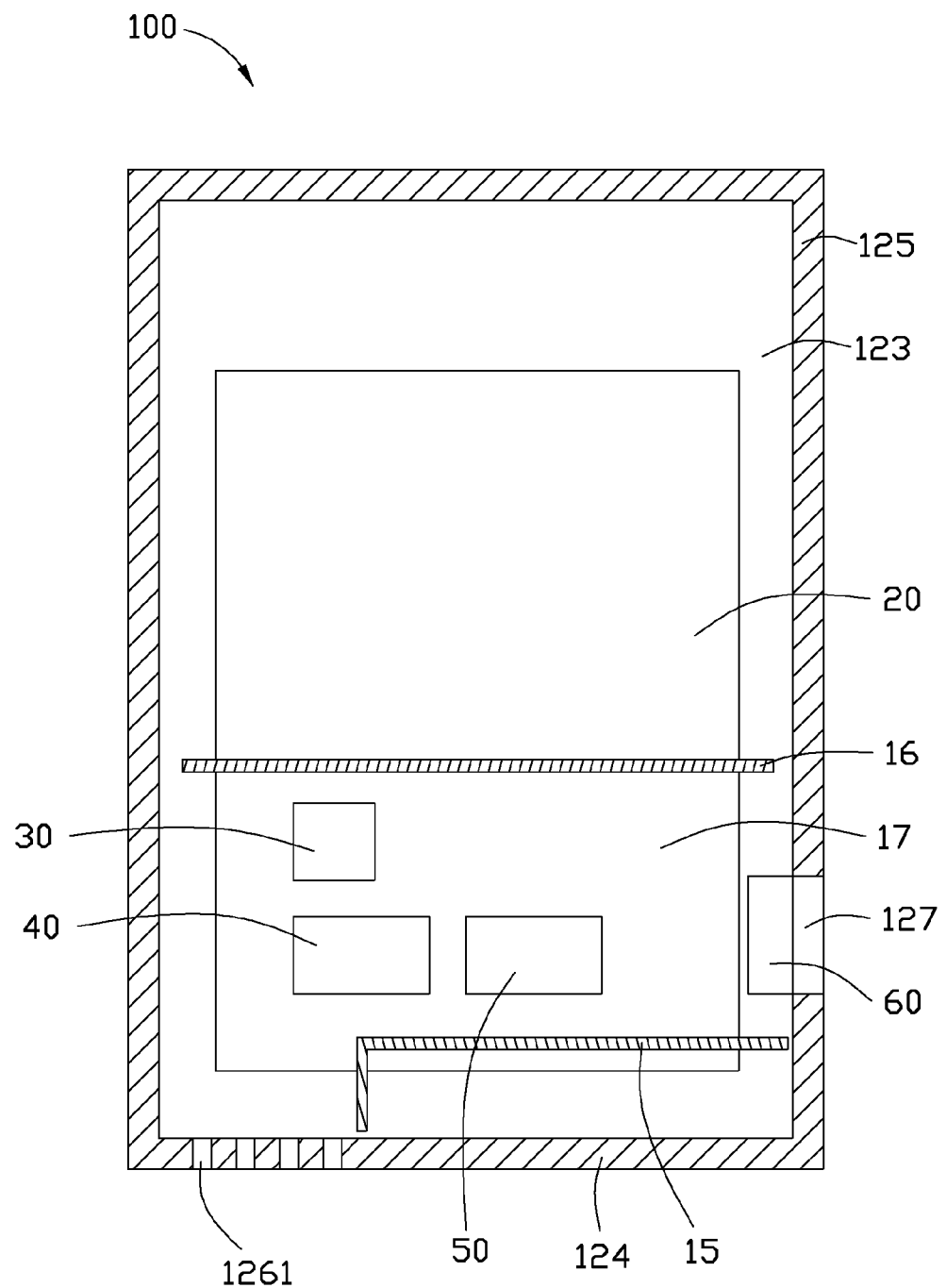
FIG. 2 is a cross-section taken along line II-II of FIG. 1.

Referring to FIGS. 1 and 2, a first embodiment of an electronic device 100 includes a case 10, a motherboard 20, an electronic component 30, a first heat dissipating member 40, a second heat dissipating member 50 and a fan 60. The motherboard 20 is fixed in the case 10. The electronic component 30 is electrically fixed on the motherboard 20. The first heat dissipating member 40 and the second dissipating member 50 are arranged on the motherboard 20 apart from each other for dissipating heat. The fan 60 is fixed on an interior side of the case 10. The electronic device 100 can be a computer host, notebook computer or server. In the illustrated embodiment, the electronic device 100 is a computer host.

In the illustrated embodiment, the case 10 includes a box 12, a top cover 14, a first airflow guide member 15, and a second airflow guide member 16. The box 12 is substantially rectangular. The box 12 includes a bottom plate 123, a first side plate 124, a second side plate 125, a third side plate (not labeled) and a fourth side plate (not labeled). The first side plate 124, the second side plate 125, the third plate and the fourth plate extend from a periphery of the bottom plate 123, and cooperatively define an opening 121. The top cover 14 and the box 12 are fixedly attached. The top cover 14 is sealed on the opening 121 of the box 12. The first airflow guide 15 and the second airflow guide 16 are fixed on the top cover 14, and spaced from each other.

The first side plate 124 defines an inlet 126 in an end of the first side plate 124 away from the second side plate 125. The second side plate 125 defines an outlet 127 on an end of the second side plate 125 adjacent to the first side plate 124. In the illustrated embodiment, the inlet 126 includes a plurality of vents 1261 defined in the first side plate 124. The outlet 127 is a fan louver 1271.

The top cover 14 is a rectangular plate. The first airflow guide member 15 and the second airflow guide 16 are disposed on an end of the top cover 14, and cooperatively define a guide channel 17. In the illustrated embodiment, the first airflow guide member 15 is a substantially L-shaped plate; and the second airflow guide member 16 is a planar plate. The first airflow guide member 15 is disposed on an edge of the inner surface of the top cover 14. The second airflow guide member 16 is disposed on a middle portion of the inner surface of the top cover 14. The first airflow guide member 15 and the second airflow guide member 16 are fixed on the top cover 14 by welding. When the top cover 14 seals the opening 121, the guide channel 17 communicates with the inlet 126 and the outlet 127 of the box 12.

In one embodiment, the electronic component 30 is a CPU. The first heat dissipating member 40 and the second heat dissipating member 50 are a plurality of cooling fins. The first heat dissipating member 40 and the second heat dissipating member 50 are fixed on the Southbridge (not shown) and the Northbridge (not shown) of the motherboard 20, respectively.

Figure 3:
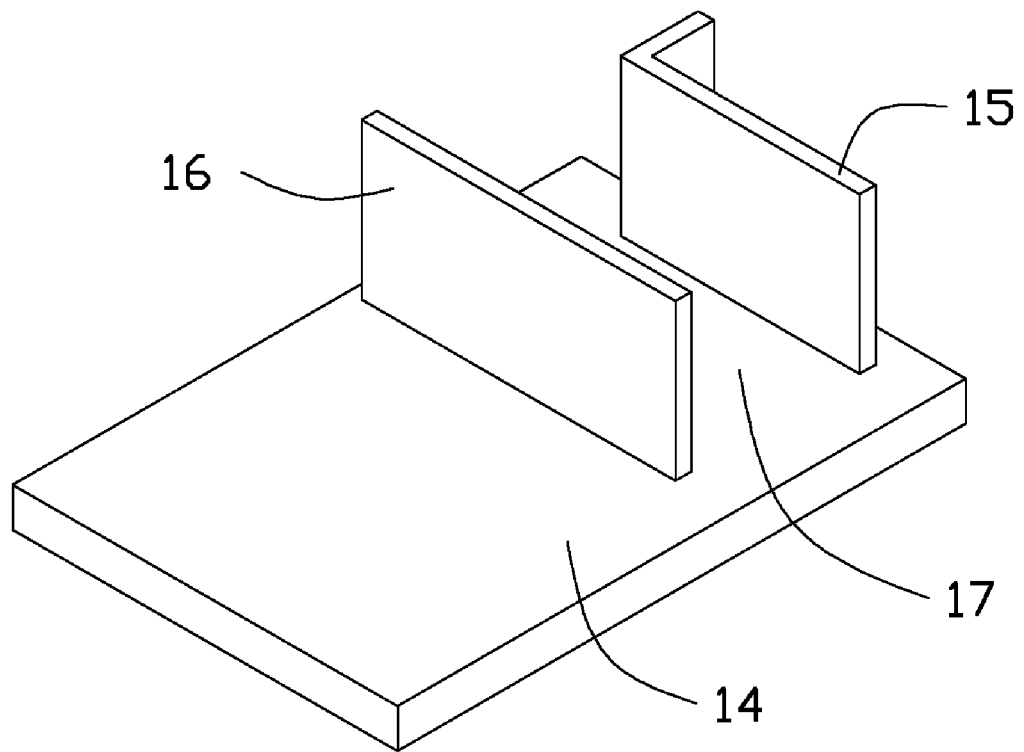
FIG. 3 is an isometric view of the top cover assembled with the first and second airflow guide members shown in FIG. 2.

Referring to FIGS. 1 through 3, during assembly of the electronic device 100, the motherboard 20 is fixed on the bottom plate 123 of the box 12. The electronic component 30, the first heat dissipating member 40, and the second heat dissipating member 50 are fixed on an end of the motherboard 20. The first heat dissipating member 40 and the second heat dissipating member 50 are disposed adjacent to the inlet 126. The fan 60 is fixed on the side plate 125 of the box 12 corresponding to the outlet 127. The top cover 14 is sealed on the opening 121 of the box 12. Both the first airflow guide member 15 and the second airflow guide member 16 resist the motherboard 20, and the first airflow guide member 15 contacts the side plate 124. The guide channel 17 communicates with the inlet 126 and the outlet 127, respectively. The electronic component 30, the first airflow guide member 40 and the second airflow guide member 50 are mounted in the guide channel 17.

Cooling airflow from the fan 60 enters the inlet 126, absorbs heat from the electronic component 30, the first heat dissipating member 40 and the second heat dissipating member 50, and is exhausted via the outlet 127 by the fan 60.

The first airflow guide member 15 and the second airflow guide member 16 cooperatively define the guide channel 17, such that the electronic component 30 dissipates heat more efficiently. Furthermore, the electronic device 100 requires no dedicated airflow guide, such that the space in the interior of the electronic device 100 is conserved.

It is to be understood that the first airflow guide member 15 and the second airflow guide member 16 can also be fixed on the bottom plate 123, the first side plate 124, the second side plate 125 or another plate.

Figure 4:
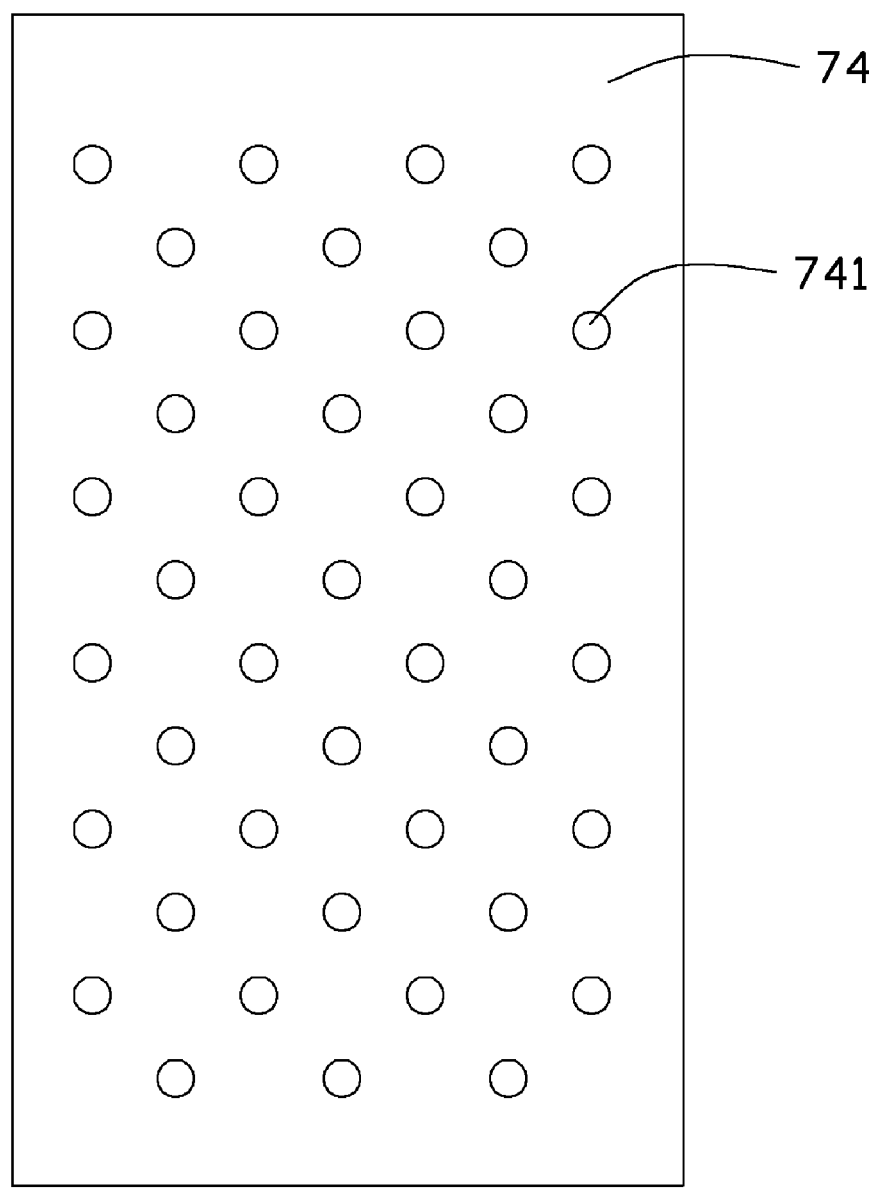
FIG. 4 is a bottom view of a top cover according to a second embodiment, as an alternative to the top cover shown in FIG. 3.

Referring to FIG. 4, a second embodiment of a top cover 74 is shown, differing from the first embodiment only in that the top cover 71 defines a plurality of threaded holes 741. The threaded holes 741 are configured in staggered arrangement. The first airflow guide member 15 and the second airflow guide member 16 are fixed on the top cover 14 via a plurality of fasteners (not shown) received in the threaded holes 741. When the fasteners are received in different threaded holes 741, the first airflow guide member 15 and the second airflow guide member 16 take different positions on the top cover 14, and varying electronic components 30 of the motherboard 20 can be received in the guide channel 17.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A case comprising:
    a box defining an opening;
    a top cover sealed on the opening;
    a first airflow guide member; and
    a second airflow guide member, wherein the first airflow guide member and the second airflow guide member are fixed on the top cover, the first airflow guide member is a L-shaped plate and the second airflow guide member is a planar plate, one wall of the first airflow guide member contacts a first side plate of the box and another wall of the first airflow guide member is parallel to the second airflow guide member, the first airflow guide member and the second airflow guide member are spaced from each other and cooperatively define a L-shaped guide channel, and the box defines an inlet in the first side plate of the box contacting the first airflow guide member and an outlet in a second side plate of the box, the inlet and the outlet communicating with the L-shaped guide channel.

2. The case of claim 1, wherein the box further comprises a bottom plate, a third side plate and a fourth side plate, the first side plate, the second side plate, the third side plate and the fourth side plate extending from a periphery of the bottom plate the first side plate connecting the second side plate.

3. The case of claim 2, wherein the inlet comprises a plurality of vents defined in the first side plate.

4. The case of claim 2, wherein the outlet is a fan louver.

5. An electronic device comprising:
    a case comprising a box defining an opening and a top cover sealing the opening;
    at least one heat dissipating member;
    a first airflow guide member; and
    a second airflow guide member, wherein the first airflow guide member and the second airflow guide member are fixed on the top cover, the first airflow guide member is a L-shaped plate and the second airflow guide member is a planar plate, one wall of the first airflow guide member contacts a side plate of the box and another wall of the first airflow guide member is parallel to the second airflow guide member, the first airflow guide member and the second airflow guide member are spaced from each other and cooperatively define a L-shaped guide channel, the box defines an inlet in the side plate of the box contacting the first airflow guide member and an outlet in another side plate of the box, the inlet and the outlet communicating with the L-shaped guide channel, and the heat dissipating member received in the L-shaped guide channel.

6. The electronic device of claim 5, wherein the box comprises a bottom plate and a first side plate, a second side plate, a third side plate and a fourth side plate extending from a periphery of the bottom plate, the inlet defined in the first side plate and the outlet defined in the second side plate.

7. The electronic device of claim 6, wherein the inlet comprises a plurality of vents defined in the first side plate.

8. The electronic device of claim 6, wherein the outlet is a fan louver.

9. The electronic device of claim 6, further comprising a motherboard fixed on the bottom plate.

10. The electronic device of claim 9, further comprising an electronic component fixed on and electrically connected to the motherboard.

11. The electronic device of claim 5, further comprising a fan corresponding to the outlet.

12. An electronic device comprising:
    a case comprising a box defining an opening and a top cover covering the opening;
    a first airflow guide member; and
    a second airflow guide member, wherein the first airflow guide member and the second airflow guide member are fixed on the top cover, the first airflow guide member is a L-shaped plate and the second airflow guide member is a planar plate, one wall of the first airflow guide member contacts a side plate of the box and another wall of the first airflow guide member is parallel to the second airflow guide member, the first airflow guide member and the second airflow guide member are spaced from each other and cooperatively define a L-shaped guide channel, and the box defines an inlet at the side plate of the box contacting the first airflow guide member and an outlet at another side plate of the box, the inlet and the outlet communicating with the L-shaped guide channel.

13. The electronic device of claim 12, wherein the box comprises a bottom plate and a first side plate, a second side plate, a third side plate and a fourth side plate extending from a periphery of the bottom plate, the inlet defined in the first side plate and the outlet defined in the second side plate.

14. The electronic device of claim 13, wherein the inlet comprises a plurality of vents defined in the first side plate.

15. The electronic device of claim 13, wherein the outlet is a fan louver.

16. The electronic device of claim 13, further comprising a motherboard fixed on the bottom plate.

17. The electronic device of claim 16, further comprising an electronic component fixed on the motherboard and electrically connected to the motherboard.

18. The electronic device of claim 12, further comprising a fan corresponding to the outlet.

19. The electronic device of claim 12, wherein the top cover defines a plurality of holes in a staggered arrangement.

\* \* \* \* \*